(12) United States Patent
Yang et al.

(10) Patent No.: US 6,777,957 B1
(45) Date of Patent: Aug. 17, 2004

(54) TEST STRUCTURE TO MEASURE INTERLAYER DIELECTRIC EFFECTS AND BREAKDOWN AND DETECT METAL DEFECTS IN FLASH MEMORIES

(75) Inventors: Nian Yang, San Jose, CA (US); Zhigang Wang, San Jose, CA (US); John Jianshi Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 40 days.

(21) Appl. No.: 10/174,734

(22) Filed: Jun. 18, 2002

(51) Int. Cl.[7] ............................................. G01R 27/26
(52) U.S. Cl. ...................... 324/661; 324/663; 324/690; 357/13; 357/88
(58) Field of Search ...................... 257/13, 88; 324/61, 324/663, 690, 636, 674

(56) References Cited

U.S. PATENT DOCUMENTS

| | | | | |
|---|---|---|---|---|
| 3,784,905 A | * | 1/1974 | Blackwell | .................. 324/663 |
| 4,345,204 A | * | 8/1982 | Shelley | ........................ 324/663 |
| 4,777,431 A | * | 10/1988 | Day et al. | .................... 324/690 |
| 6,541,278 B2 | * | 4/2003 | Morita et al. | .................. 438/3 |
| 2003/0034486 A1 | * | 2/2003 | Korgel | ........................ 257/13 |

* cited by examiner

Primary Examiner—David Nelms
Assistant Examiner—Dao H. Nguyen

(57) ABSTRACT

An apparatus for testing a dielectric property of a material constituting the interlayer dielectric of a flash memory device is formed by a layer (122) of the dielectric material disposed throughout a test structure (200) representative of the flash memory device and a plurality of conductors (117A, 117B, 117C) disposed within that layer (122) or a pair of planar conductors (402, 404; 502, 503; 504, 505; 506, 507; 508, 509) deposited such that the conductors (402, 404; 502, 503; 504, 505; 506, 507; 508, 509) are substantially parallel to each other and the layer (122) of dielectric material is disposed throughout a test structure (400, 500) so as to separate the conductors (402, 404; 502, 503; 504, 505; 506, 507; 508, 509), the test structure (400, 500) functioning as a capacitor. The apparatus may also test a conductive property of a material constituting the conducting lines of a flash memory device by disposing a conductor (801, 901) through the dielectric material (122).

17 Claims, 12 Drawing Sheets

TEST STRUCTURE TO MEASURE INTERLAYER DIELECTRIC EFFECTS AND BREAKDOWN AND DETECT METAL DEFECTS IN FLASH MEMORIES

BACKGROUND OF THE INVENTION

1. Field of the Invention

The present invention relates to the field of memory testing. Specifically, an embodiment of the present invention relates to a test structure to measure interlayer dielectric charging and breakdown and detect metal defects in flash memories.

2. Related Art

The development of flash memory technology has resulted in re-writable memories that can hold its data content without power. As their technology has progressed, the density of flash memory devices increased. Correspondingly, backend processes involved in their production have become more complicated and more metal layers have become necessary to implement their functionality. Currently, a 3-level metal process constitutes the state of the art. However, in the foreseeable future, a 4-level or higher metal process will become necessary.

As more metal layers are added to advanced flash memory technology devices, the device densities increase and the layering and routing of the metal layers becomes complicated. Important characteristic properties of the flash memories must be maintained, notwithstanding the increasing densities and complication. These important characteristic flash memory properties include a high degree of data retention, a low degree of capacitive charge leakage, and a high degree reliability.

State of the art flash memories can reliably effectuate several hundred thousand program/erase cycles. Programming and erasing of flash memories is effectuated by relatively high program/erase voltages applied via metal lines. Applying the high voltage program/erase voltages via metal lines further challenges the backend process around the metal formation. One important such backend process is the formation of an interlayer dielectric (ILD) such as tetraethoxysilane (TEOS) between different layers of conductors. The conductors can include aluminum (Al), polycrystalline silicon (POLY), tungsten silicide ($WSi_2$), and tungsten (W), among others.

Charge stability is crucial to the performance of flash memories, as compared to the performance of, for example regular logic devices. One difference between flash memories and regular logic devices is the operating voltages present. Regular logic devices typically operate with voltages on the order of 1.5 Volts. Flash memories, on the other hand, typically operate at higher voltages. Flash memory programming voltages can range from 5–7 Volts. Their erase voltages are even higher, ranging from 11–18 Volts. This is because, to effectuate the erase action, the voltage must be high enough to force electrons stored in a charged layer of the memory to tunnel through an tunnel oxide layer into substrate.

Designed for repeated cyclic operations at such high voltages, flash memory ILDs are subject to voltage driven stresses, which the ILDs of other devices, such as logic circuits, do not confront These voltage driven stresses may degrade the operating characteristics of the flash memory ILDs in several ways. Degradation of the dielectric integrity of the ILD is one such problem. Degradation of the ILD occurs when voltage stresses actually accumulate to damage the ILD in such a way that it no longer performs its dielectric function effectively.

When dielectric degradation occurs, the dielectric constant of the ILD is reduced. If dielectric degradation is severe enough, the dielectric can be punctured or burned through, allowing a conductive path through the ILD and effectively electrically shorting conductors meant to be insulated.

Charging of the ILD is another problem by which the operating characteristics of an flash memory ILD may be degraded. Charging effects are directly proportional to the voltages driving them. Thus, charging voltages in flash memories can be more problematic than in regular logic devices. Charging effects within the ILD can strongly effect charge stability, which is crucial to data storage within the flash memory in which the ILD is deployed. Thus, the dielectric properties of the ILD used in a flash memory device become critical to their performance.

Conventionally, dielectric integrity is tested by measuring the leakage current as a function of voltage and/or at a specific elevated voltage as a function of time for a flash memory device and its peripherals. ILD charging effects are conventionally determined by examining the threshold voltage ($V_t$) shifts of the flash memory and peripheral devices. However, these do not provide very accurate measurement of the properties of the ILD, itself. Rather, they test the overall dielectric integrity and charging effects of the entire flash memory and peripherals.

Considering charging effects for example, $V_t$ is proportional to the charge $Q_{ILD}$ within the ILD. However, it is also proportional to the charge Q within the flash memory device, itself, as a total, complete assembly. Thus conventional $V_t$ shift measurement can provide no information about the charging within the ILD itself that is not obfuscated by the effects of the other device and peripheral components. Determination of the dielectric integrity by the conventional means similarly obscures the dielectric integrity of the ILD itself. No conventional means exists to examine the dielectric integrity and/or the charging of the ILD used to fabricate a flash memory device, in and of itself.

Another backend process challenge particular to flash memories and related to the high voltage program/erase cycles involves the conductors, specifically the metal lines, in conjunction with the ILD. These metal lines constitute the wordlines and bitlines of the flash memories and ILD insulates them from each other and from other components of the flash memory device. Metal lines within flash memories are thin; they have thicknesses on the order of 4,000 Angstroms (Å). However they are often quite long relative to their width; lengths on the order of several hundred microns are not uncommon for flash memories' conductors.

Accordingly, the paths these conductors take through their insulating ILD matrix may be quite complex. These paths are often repeatedly articulated throughout the flash memory device, such that the metal conductors form corners. The current driven through these long, thin, articulated conductors by the voltages at which flash memories operate can cause problems in both the conductors themselves and the ILD insulating them. One such problem is local hot spots, which are portions of the conductor that rise in temperature relative to the rest of the conductor.

This heating is related in one instance to current crowding at the points of conductor articulation. This excess heat is dissipated into the surrounding ILD, and may cause defects such as voids or thermal transformations therein. These defects can reduce the dielectric constant of the ILD locally, and be reflected in overall dielectric degradation of the ILD as a whole. Further, voids can become so large that the ILD can fail as an insulator at the void, with concomitant electrical failures such as shorting.

Another problem related to the current driven through the conductors by the voltages at which flash memories operate is that of electromigration. Electromigration weakens the current carrying capabilities of the conductors by actual damage to the metal such as thinning and attendant local resistance increase and resulting production of even more heating in the area. The conductor can actually melt open, which causes electrical failure of the flash memory. Further, electromigration causes movement of metal atoms from the conductor into the surrounding ILD. This metal contamination then lowers the dielectric constant of the ILD, and makes possible compounding the conductor related problems with problems in the dielectric.

Conventional means to test the metal conductors used in flash memories typically are applied to the metal itself, without it being routed through and insulated by dielectric. This approach is problematic because it lacks in situ authenticity. Such conductors in real flash memories are routed within a matrix of ILD, which effects the metal both electrically and thermally and thus effects the degradation of the metal under test.

Thus, conventional testing approaches to flash memories suffer an inability to isolate the ILD under examination and observe effects thereon apart from the flash memory itself and peripherals. Further, conventional testing approaches to flash memories suffer an inability to examine effects on metal conductors in situ. Moreover, conventional testing approaches to flash memories requires a multiplicity of separate test structures, one to measure dielectric degradation, another to measure charging, and yet another to examine metal conductors. This is inefficient and costly.

SUMMARY OF THE INVENTION

A test structure to measure interlayer dielectric effects and breakdown and detect metal defects in flash memories is disclosed. In one embodiment, an apparatus for testing a dielectric property of a material constituting the interlayer dielectric of a flash memory device is formed by a layer of the dielectric material disposed throughout a test structure representative of the flash memory device and a plurality of conductors disposed within that layer, wherein the conductors function to electrically test the layer. A pair of planar conductors deposited such that the conductors are substantially parallel to each other and the layer of dielectric material is disposed throughout the test structure so as to separate the conductors such that the test structure functions as a capacitor. The apparatus may also test a conductive property of a material comprising the conducting lines of a flash memory device by disposing a conductor through the dielectric material.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

The present invention is discussed primarily in the context of a test structure to measure interlayer dielectric effects and breakdown and detect metal defects in flash memories. One embodiment of the present invention effectuates testing of the dielectric properties of interlayer dielectric (ILD) comprising a flash memory device, without obfuscating information regarding the ILD with superfluous data from non-ILD components of the flash memory. One embodiment of the present invention effectuates testing the charging effects of the ILD comprising a flash memory device without obfuscating information regarding the ILD with superfluous data from non-ILD components of the flash memory. One embodiment of the present invention effectuates in situ testing of the metal conductors comprising a flash memory device.

Figure 1:
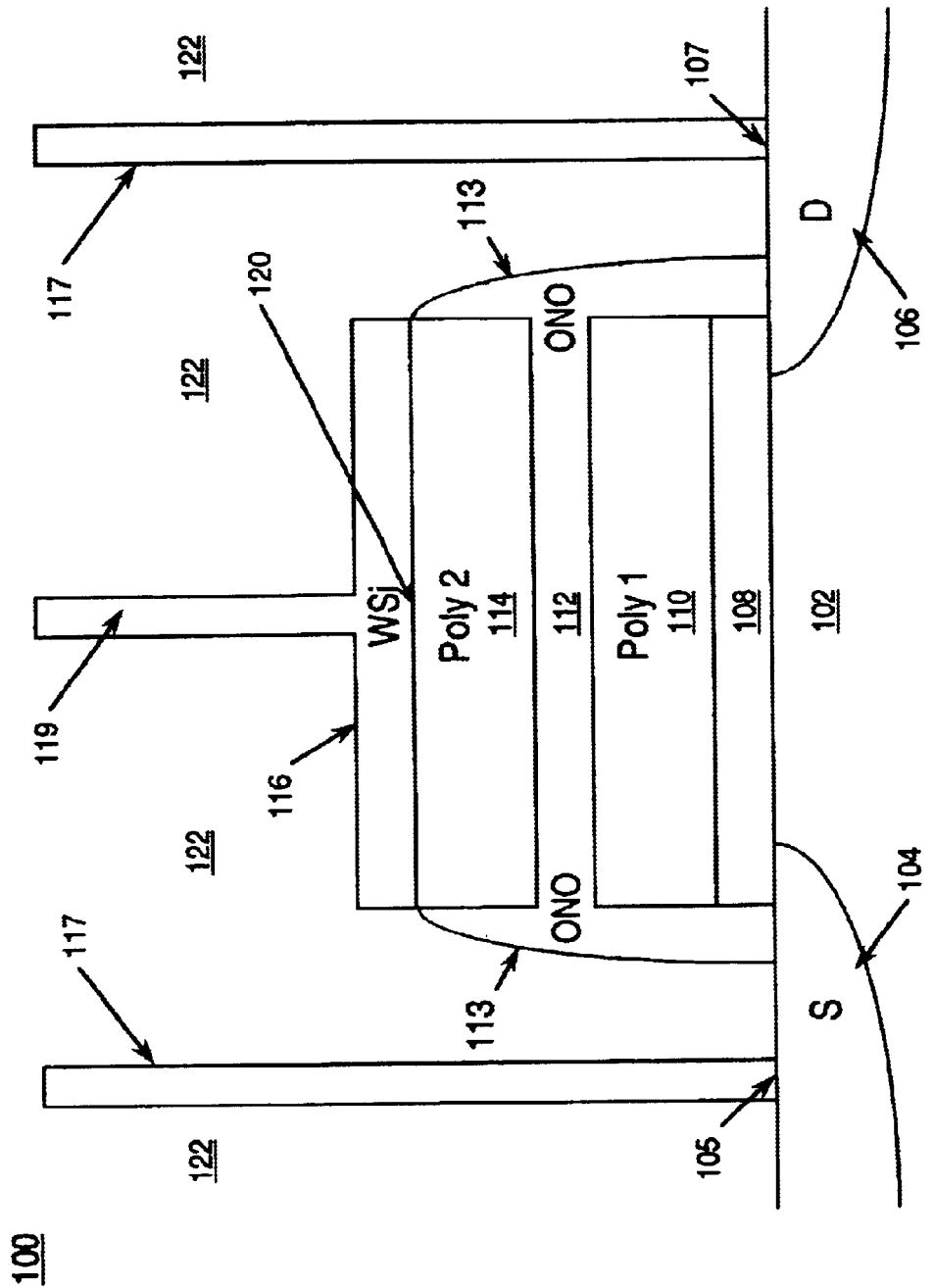
FIG. 1 is a diagram of a the structure of a flash memory device with components amenable to testing by an embodiment of the present invention.

FIG. 1 depicts a cutaway side view of the structure of a flash memory device 100 with components amenable to testing by an embodiment of the present invention. Flash memory device 100 is formed as a single transistor device upon silicon (Si) substrate 102 by a backend process. A source region 104 is formed on one side of memory device 100 in substrate 102. A drain region 106 is formed on the opposite side of device 100 in substrate 102. Tunnel oxide layer 108 is deposited over substrate 102 so as to cover a portion of source 104 and drain 106.

Flash memory device 100 operates as a gated transistor device. A charge stores data within flash memory device 100 within a first polycrystalline silicon (POLY) layer (POLY-1) 110. POLY-1 layer 110 electrically floats, deposited between a tunnel oxide (T-Ox) layer 108. and a dielectric layer comprised of an oxide-nitride-oxide layer (ONO) 112. T-Ox layer 108 is deposited directly over a silicon (Si) substrate 102.

A control gate 120 is comprised by a second POLY layer (POLY-2) 114 disposed upon the surface of ONO layer 112 opposite from the surface of ONO layer 112 disposed upon POLY-1 layer 110. Additional ONO material 113 is disposed from the surface of POLY-2 layer 114 opposite from ONO layer 112 down to the surface of substrate 102 comprising source 104 and drain 106.

A high 'program' voltage of 5–7 V injects charge into POLY-1 layer 110 through T-Ox layer 108 from drain 106. An higher 'erase' voltage of 11–18 V pushes electrons out of POLY-1 layer 110 into source 104, which in one embodiment is grounded. The injection of these program and erase voltages is controlled by POLY-2 layer 114, which functions as a gate 120. A conductive layer 116 of $WSi_2$ or another conductive silicide is disposed upon the surface of POLY-2 layer 114 opposite from ONO layer 112.

Another metal-1 conductor 119 provides connection from the top of flash memory device 100 to conductive layer 116 and gate 120. Metal-1 conductor 119, in one embodiment, is aluminum (Al), and is on the order of 4,000 Å in length. Metal-1 conductor 119 functions as a word line for flash memory device 100.

Metal-1 conductors 117 are formed to electrically access source 104 and drain 106. Metal-1 conductors 117 are tungsten suicide ($WSi_2$) in one embodiment. In another embodiment, the metal-1 conductors are be another conductive material, such as aluminum (Al) or tungsten (W). Metal-1 conductors 117 are deposited to fill in holes formed in dielectric 122 to access source 104 and drain 106. Metal-1 conductors 117 in one embodiment are on the order of 8,000 Å to 16,000 Å in length, to reach source 104 and drain 106 from the upper parts of flash memory device 100.

Metal-1 conductor 117 interconnects with source 104 at contact 105. Metal-1 conductor 117 interconnects with drain 106 at contact 107. Metal-1 conductors 117 function as bit lines for flash memory device 100.

A dielectric 122 fills regions between conductors 117, conductor 119, source 104, drain 106, and conductive layer 116 such that a high degree of electrical insulation is provided. Dielectric 122, in one embodiment, is tetraethoxysilane (TEOS) or a similar dielectric material.

Figure 2:
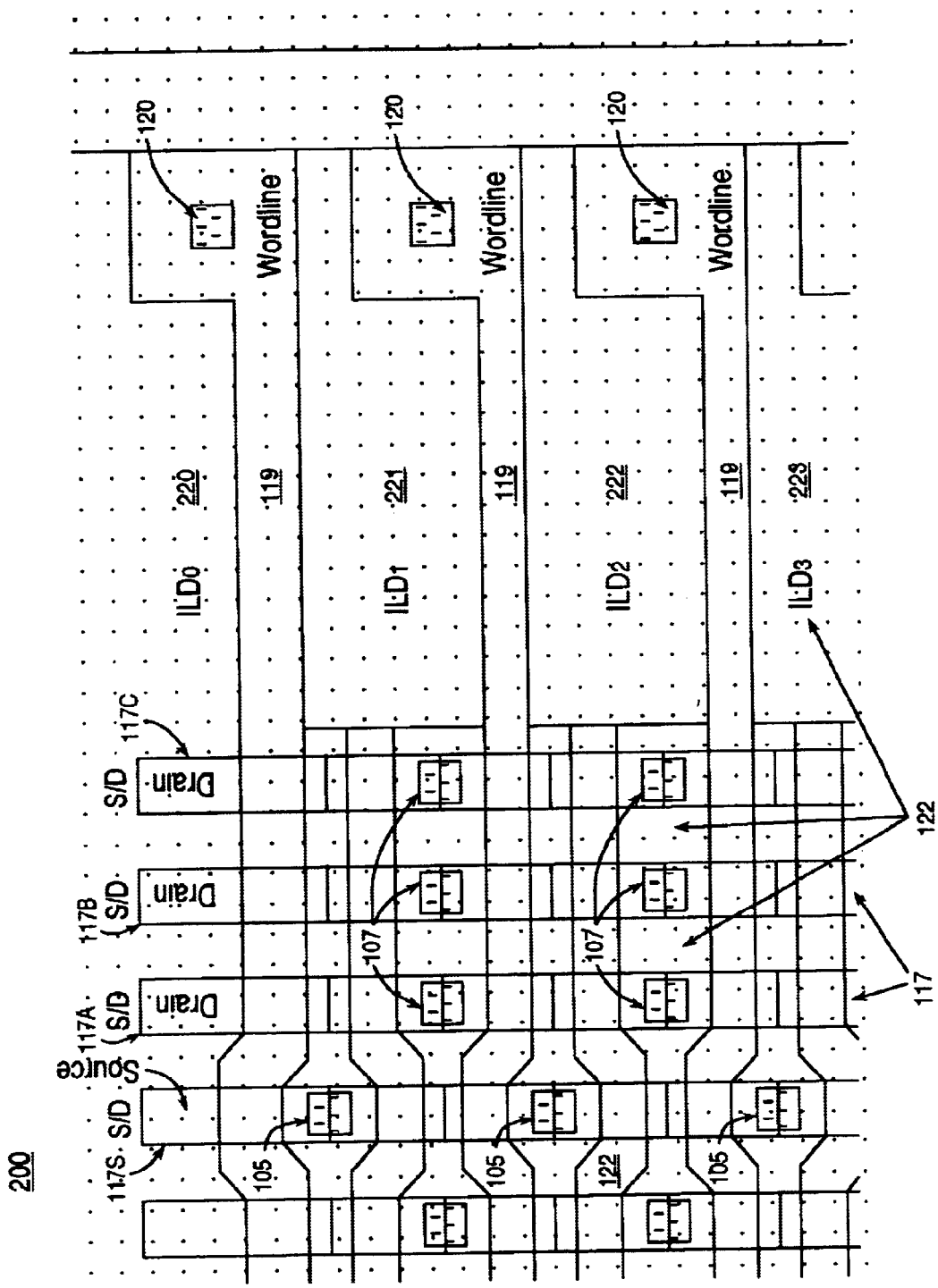
FIG. 2 is a diagram of a test structure used for measuring dielectric degradation in a memory core-alike area according to one embodiment of the present invention.

FIG. 2 depicts a top-down view of a test structure 200 used for measuring dielectric degradation in a memory core-alike area according to one embodiment of the present invention. Areas of test structure 200 between electrically active components are filled with ILD 117. Test structure 200 effectuates the testing of the dielectric properties, including breakdown and charging, of the ILD 117.

In one embodiment, test structure 200 has four layers, each with an ILD layer. These ILD layers include a first $ILD^0$ layer 220, a second $ILD^1$ layer 221, a third $ILD^2$ layer 222, and a fourth $ILD^3$ layer 223. In another embodiment, test structure 200 has more than four layers, each with an ILD layer. Each layer of test structure 200 can house any number of individual flash memory cells. In one embodiment, each layer of test structure 200 houses 512 individual cells. Each individual cell comprising test structure 100 is typified in one embodiment by a flash memory cell (e.g., flash memory cell 100; FIG. 1).

Contacts 120 allow electrical interconnection to wordlines 119 embedded in ILD 117. Wordlines 119 are metal-1 lines, comprised in one embodiment by Al. In another embodiment, wordlines 119 may be comprised of POLY or $WSi_2$. Metal-1 bitlines 117, comprised in one embodiment by $WSi_2$, allow electrical interconnection to individual sources and drains (e.g., source 104, drain 106; FIG. 1) via contacts 105 and contacts 107, respectively. In as much as FIG. 2 is a top-down view of the test structure 200, the individual flash memory cell devices (e.g., flash memory cell 100; FIG. 1) are at the bottom of the structure (e.g., the opposite end from the top end viewed).

Thus, metal-1 lines 117 coming into test structure 200 is routed over the individual flash memory cell devices and gets connected to the device contacts via $WSi_2$ filling holes formed from the device to the routed locale of the metal-1 lines 117. In the present embodiment, all of the individual flash memory devices share a common source, which is typically grounded. Their drains however are kept electrically separated.

This arrangement effectuates in situ testing of the ILD within test device 200, by applying a cyclic high test voltage between two adjacent drain lines, such as between bitline 117A and bitline 117B, or between bitline 117B and bitline 117C. and measuring the current flow between them driven by the test voltage. In this manner, the dielectric properties of the ILD between the adjacent drain lines is directly tested. Alternatively, larger volumes of the ILD comprising test structure 200 can be tested by applying a high test voltage between non-adjacent bitlines. For example, the high test voltage can be applied between bitline 17A and bitline 117C. Where test voltages are applied to non-adjacent bitlines, the bitlines not under direct test voltage application may be electrically guarded.

Figure 3:
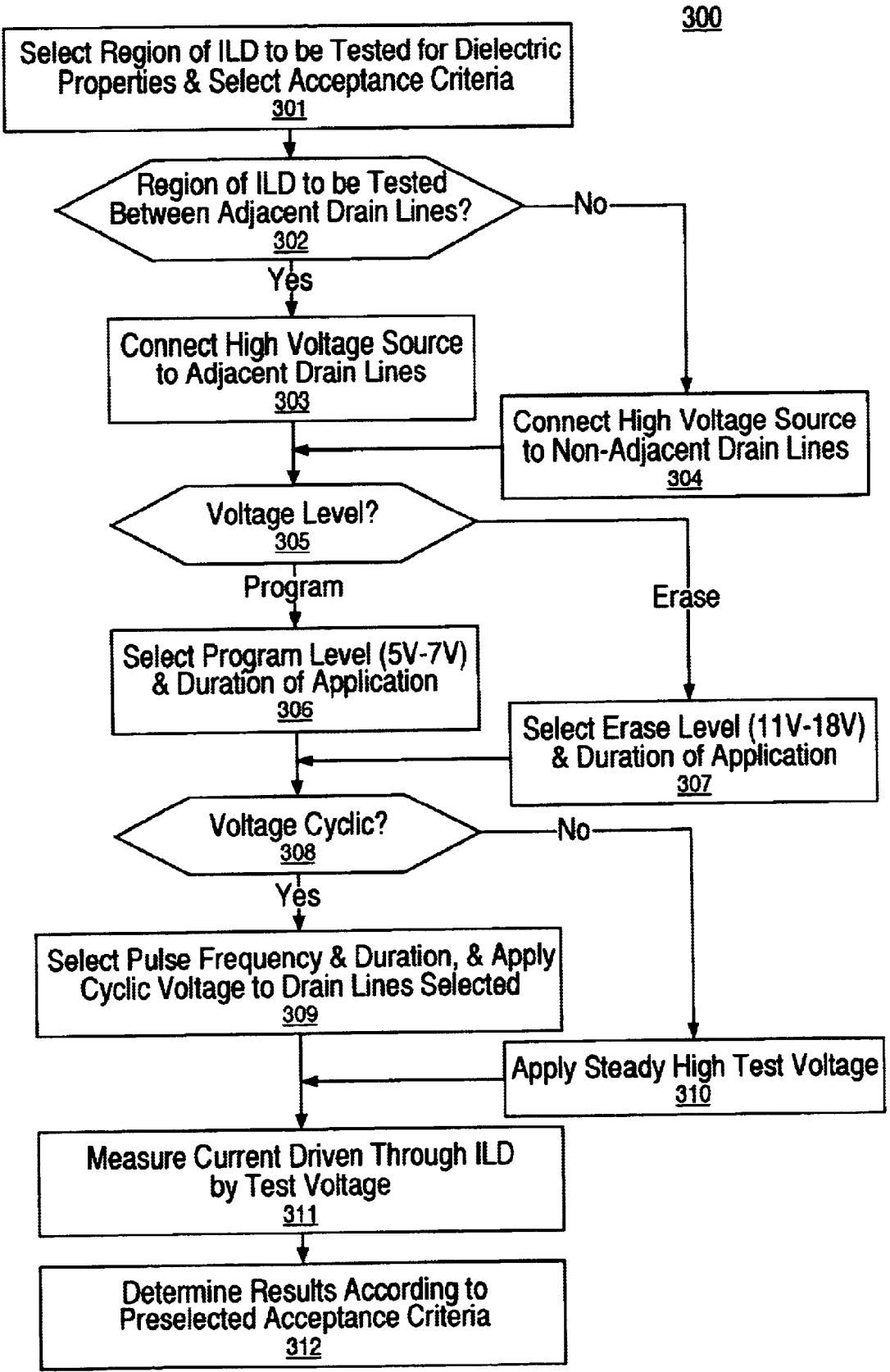
FIG. 3 is a flowchart of the steps in a method for determining dielectric properties of ILD with test voltage applied on drain lines, according to an embodiment of the present invention.

Referring to FIG. 3, a flowchart describes the steps in a process 300 for testing the dielectric properties of ILD within a flash memory test structure such as test structure 200 (FIG. 2). The dielectric tests that process 300 can effectuate include measurement of dielectric absorption, dielectric breakdown, leakage current passage at applied voltage, leakage current passage at rising voltage, and threshold voltage.

Process 300 begins with step 301, wherein a region of ILD to be tested for its dielectric properties is selected and acceptance criteria are selected to determine the condition of the dielectric according to the dielectric properties detected.

In step 302, it is determined if the region of ILD to be tested is between adjacent drain lines. If it is determined that the ILD region to be tested is between adjacent drain lines, then in step 303, a high voltage source is connected to adjacent drain lines. If it determined that the region of ILD to be tested is greater than the volume of ILD between adjacent drain lines (e.g., the region of ILD to be tested lies between non-adjacent drain lines), then in step 304 the high voltage source is connected to non-adjacent drain lines.

In step 305, the voltage level at which the ILD comprising the test structure is to be tested is determined. If the voltage level is to mimic the program voltages of a flash memory device represented by the test structure, then in step 306, the program voltage level of between 5 V and 7 V and its duration of application is selected. If the voltage level is to mimic the erase voltages of a flash memory device represented by the test structure, then in step 307, the erase voltage level of between 11 V and 18 V and its duration of application is selected.

In step 308, the duration of voltage application and pulse frequency and duration is selected and it is determined whether the test voltages are to be cyclic or not and. If the test voltages are to be cyclic, then in step 309, a pulse frequency and duration for the cyclic test voltages are applied selected and the cyclic voltages are applied to the drain lines selected for the selected test duration. If the test voltages are not to be cyclic, then in step 310, a steady high test voltage is applied to the drain lines selected for the selected test duration.

In step 311, the current driven through the ILD by the applied test voltage (e.g., dielectric leakage current) is measured. In step 312, the current measured to be driven through the ILD by the applied test voltage is compared to the selected acceptance criteria and the test results are determined accordingly. If the test criteria are met or exceeded, the test results pass. If the acceptance criteria are not met, the test results fail.

Figure 4A:
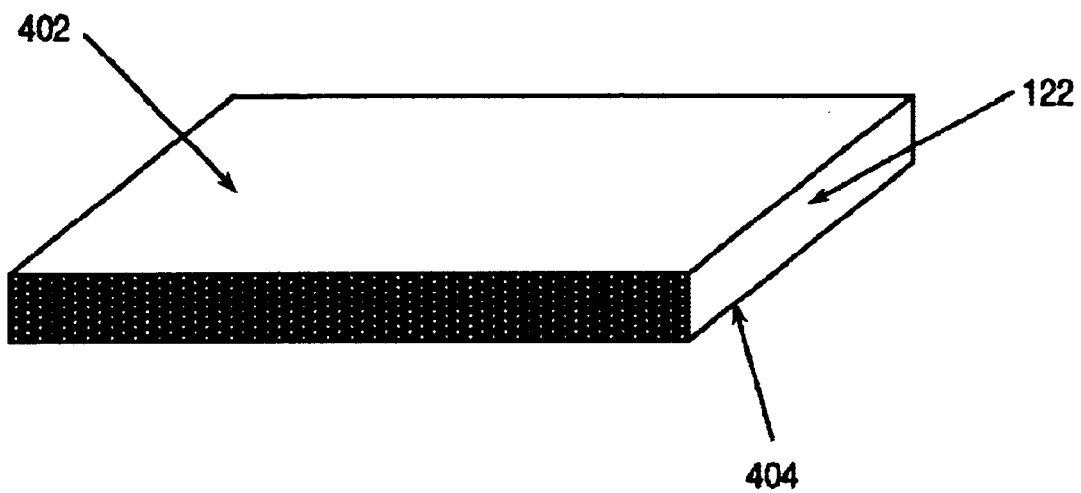
FIG. 4A is a diagram from a first perspective of a test structure for determining charging effects of ILD and dielectric degradation according to one embodiment of the present invention.
Figure 4B:
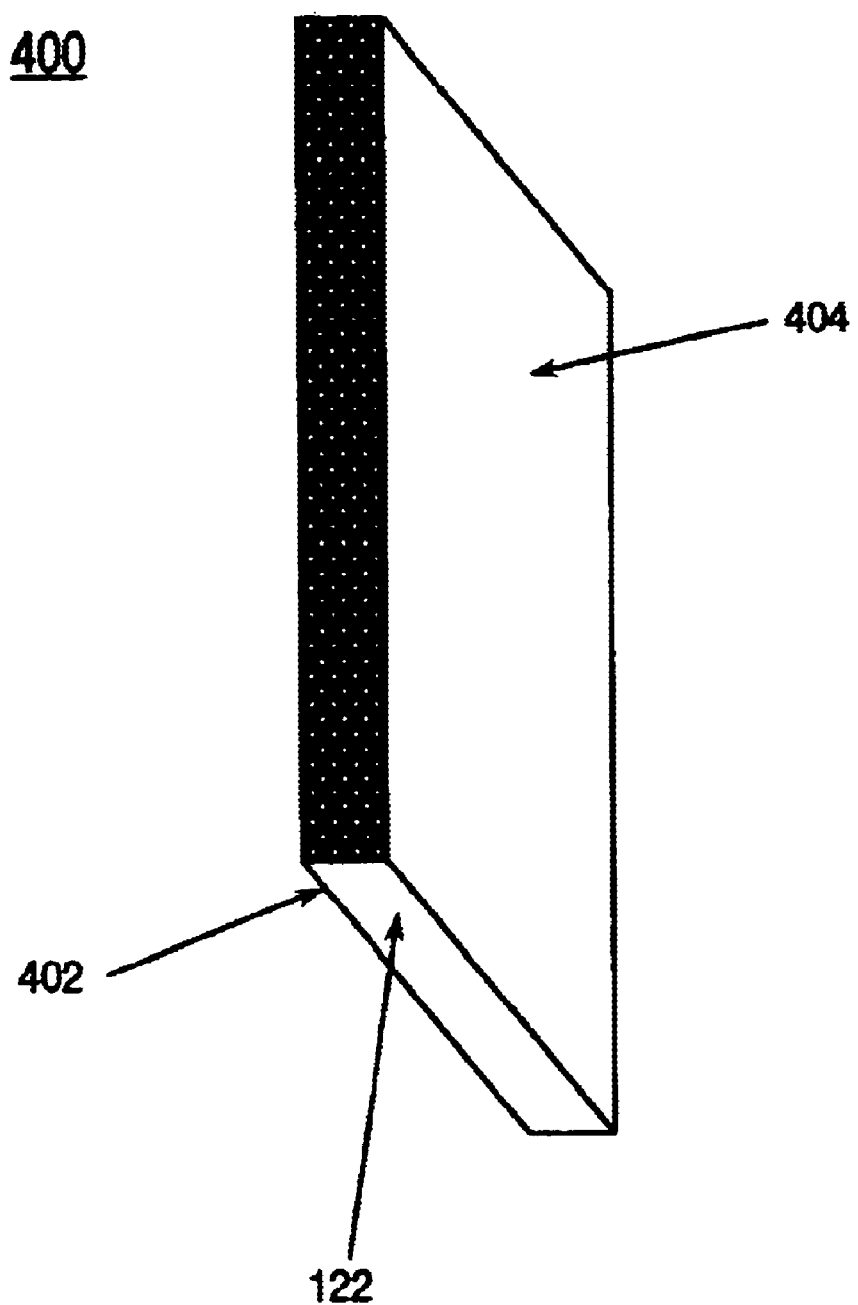
FIG. 4B is a diagram from a second perspective of a test structure for determining charging effects of ILD and dielectric degradation according to one embodiment of the present invention.

Referring now to FIGS. 4A and 4B, a test structure 400 is configured to effectuate capacitance measurements to determine the charging effect of ILD layer 122. Determination of the dielectric properties of ILD 122 between conductive layers 402 and 404 for both the core and peripheral areas of a flash memory device (e.g., flash memory device 100; FIG. 1) is also effectuated by test structure 400. The dielectric properties determined include measurement of the breakdown voltage between the conductive layers 402 and 404.

FIG. 4A displays test structure 400 from a perspective showing more of conductive layer 402. In one embodiment, conductive layer 402 is a metal such as W or Al, or a conductive material such as a metallic silicide, such as $WSi_2$. FIG. 4B displays test structure 400 from a different perspective than FIG. 4A. In FIG. 4B, more of conductive layer 404 is displayed. Conductive layer 404 can be the same or another metal or other conductive material as conductive layer 402. Alternatively, conductive layer 404 can be POLY.

Test structure 400 effectively forms a large capacitor. Conductive layers 402 and 404 form substantially parallel planar conductive plates. These metal plates are separated by ILD 122, which functions as the dielectric of the capacitor formed by test structure 400. The potential of either conductive surface is raised to a high voltage with respect to the other plate. Alternatively, potentials of opposite polarity are applied to plates 402 and 404. In either case, the electric field is distributed through ILD 122. The dielectric properties of ILD 122 can be measured accordingly. In one embodiment, the thickness of ILD 122 is between 8,000 Å and 16,000 Å.

Figure 5:
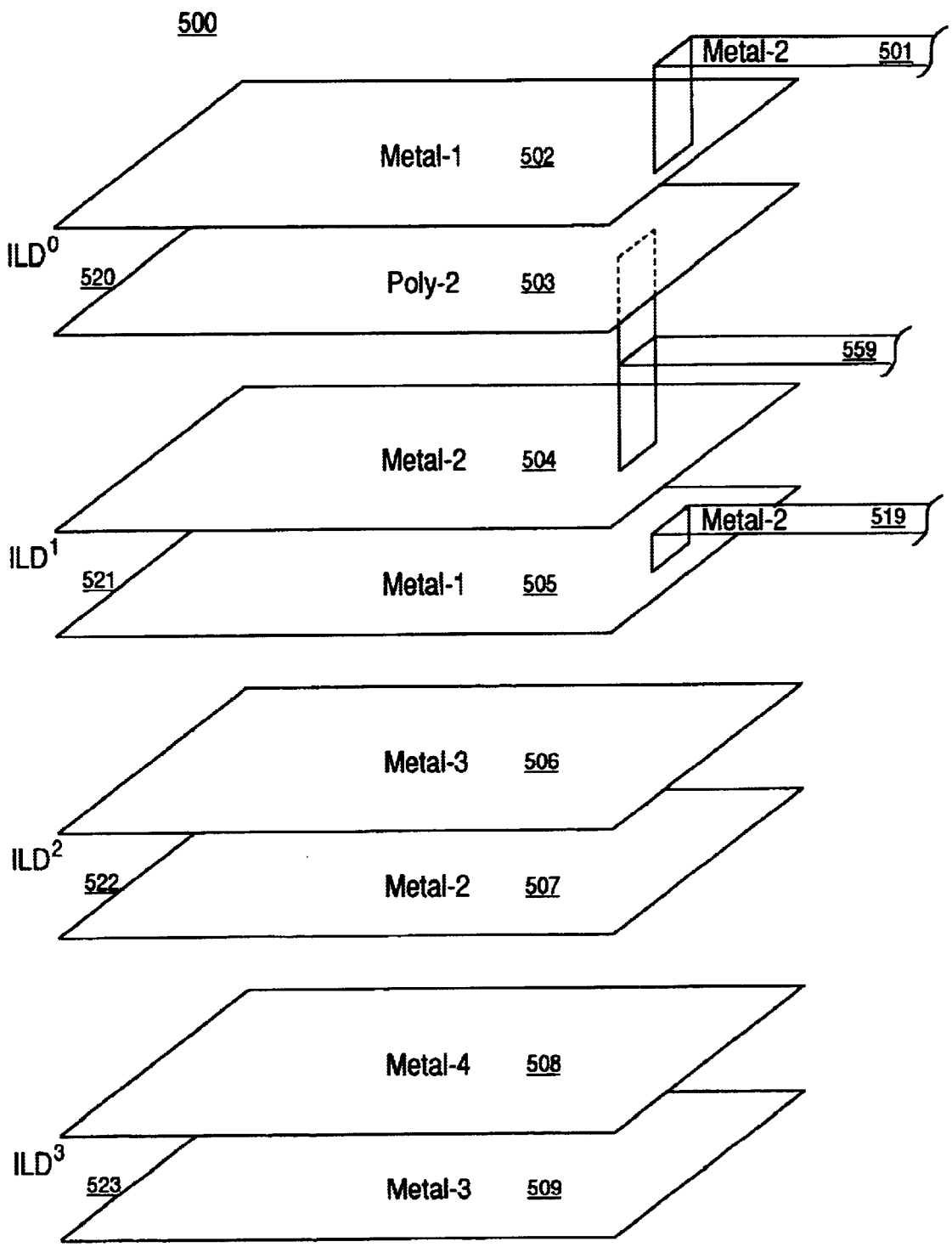
FIG. 5 is a diagram of a test structure for determining charging effects and dielectric degradation of ILD between several metal layers according to one embodiment of the present invention.

With reference to FIG. 5, several capacitors as typified by test structure 400 are stacked within a composite capacitive test structure 500 to test as many layers of a flash memory device as are present. Currently, the state of the art in flash memories is approaching four layers. Thus, FIG. 5 depicts a test structure 500 with four capacitor layers. However, it is appreciated that test structure 500 can have as many layers as needed to test any flash memory devices.

Test structure 500 effectuates testing charging effects of ILD dielectric material comprising flash memory apart from the actual memory cells, which are covered and sealed by the ILD material of the first stage of test structure 500, which is $ILD^0$ 520. The thickness of the ILD material comprising each layer $ILD^0$ 520, $ILD^1$ 521, $ILD^2$ 522, and $ILD^3$ 523 is uniform in one embodiment, and in one embodiment can be made in any thickness between 8,000 Å and 16,000 Å.

The size of the conductive capacitor plates 502–509 is uniform in one embodiment. The capacitor plates 502–509 can be made of any size as needed during fabrication of test structure 500. In one embodiment, the capacitor plates 502–509 are on the order of 100 μm by 100 μm.

A test potential is applied between metal-1 layer 502 and POLY-2 layer 503 by metal-2 line 501 and test connection 559, which can be another metal line or other conductor. This arrangement effectuates the testing of the upper dielectric layer depicted in FIG. 5, which is $ILD^0$ 520. A test potential can also be applied between metal-layer 505 and metal-2 layer 504 by metal-2 line 519 and test connection 559, which again can be another metal line or other conductor. This arrangement effectuates the testing of the second dielectric layer from the top depicted in FIG. 5, which is $ILD^1$ 521.

In a similar manner of routing and connection of conductors which serve as test potential applicators, the third layer of dielectric ILD2 522 can be tested by placing a test potential between metal-3 plate 506 and metal-2 plate 507. The fourth dielectric layer ILD3 is similarly tested by placing test potential between metal-4 plate 508 and metal-3 plate 509.

Figure 6A:
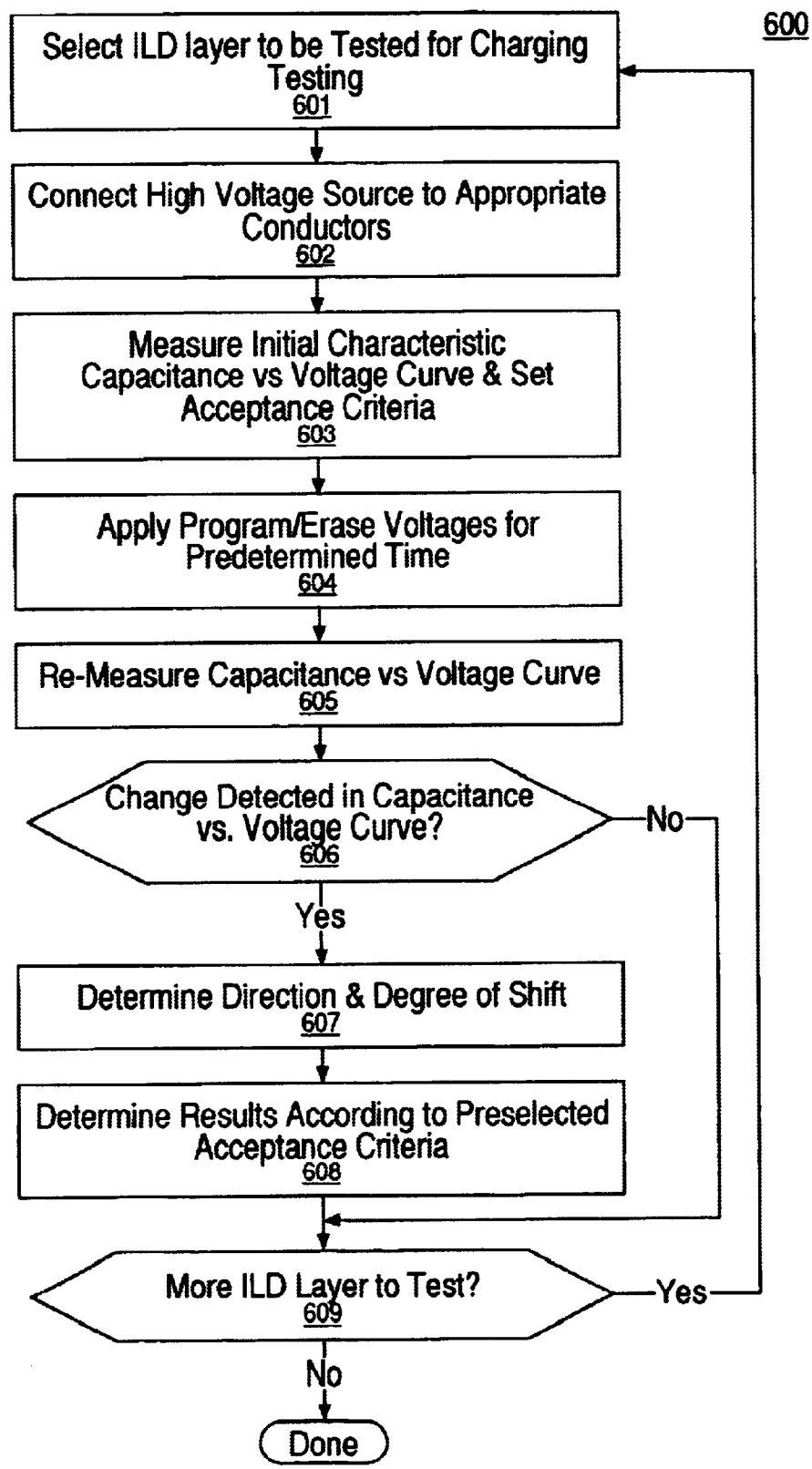
FIG. 6A is a flowchart of the steps in a method for determining charging effects In flash memory ILD according to an embodiment of the present invention.

With reference to FIG. 6A, a process 600 effectuates dielectric charging testing, in one embodiment, by determining an initial characteristic capacitance versus voltage curve for the ILD comprising the flash memory device, applying cyclic high program and/or erase voltages, and then detecting any shifting in the curve. Process 600, in one embodiment, is performed upon an ILD charging test structure, such as test structure 500 of FIG. 5.

Process 600 begins with step 601, wherein the layer of ILD to be tested is selected. In step 602, a high voltage test source is connected to conductors appropriate to charge conductive plates. The ILD to be tested is between the conductive plates to be charged by the high voltage test source.

Figure 6B:
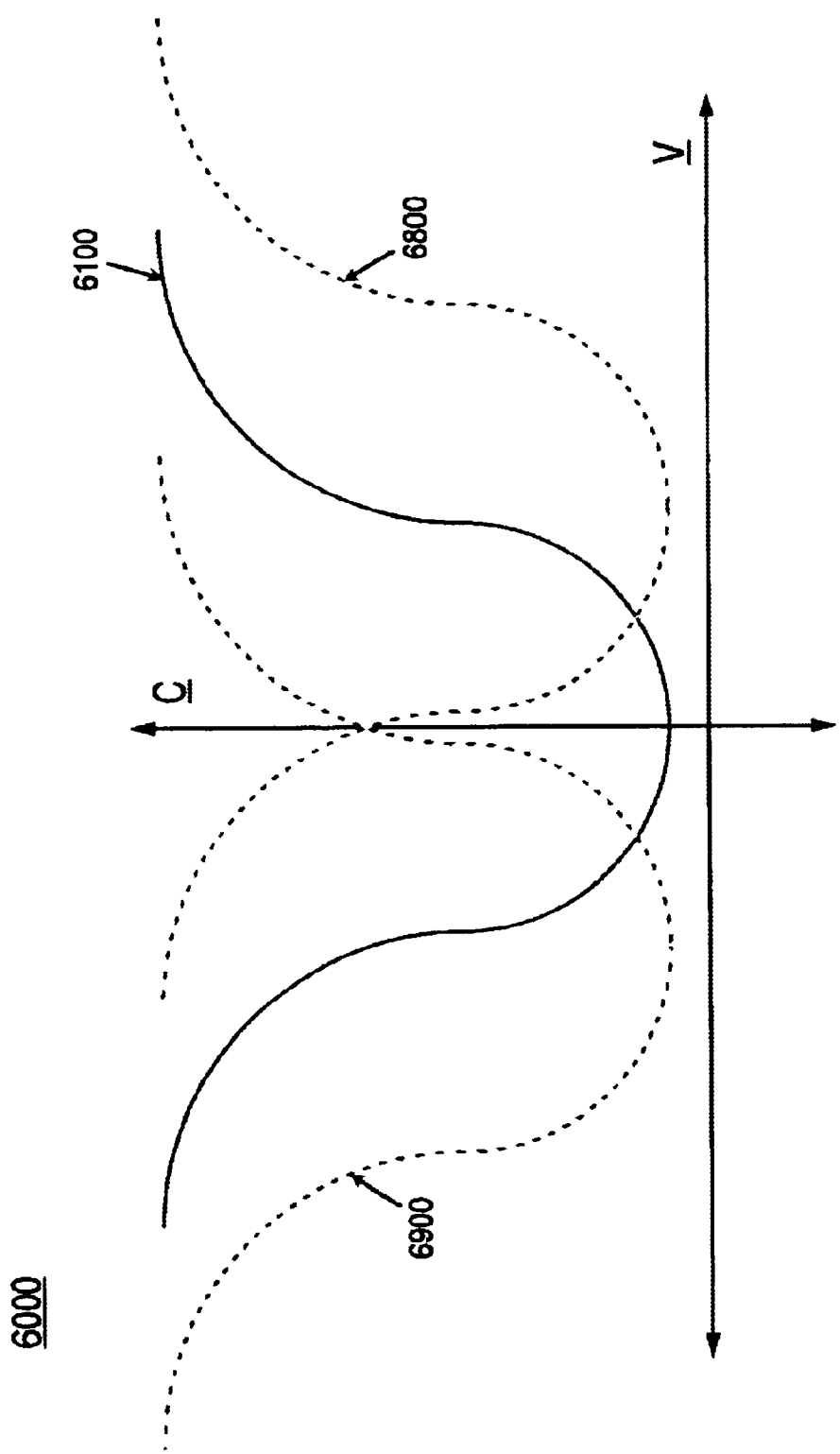
FIG. 6B depicts capacitance versus voltage curves from charging tests on ILD according to an embodiment of the present invention.

In step 603, an initial characteristic capacitance versus voltage curve is measured and acceptance criteria for any changes in these initial characteristics are determined. The capacitance versus voltage (C vs. V) curve plots capacitance of the ILD as a function of voltage, such as is depicted by an exemplary C vs. V curve plot 6000 in FIG. 6B. In FIG. 6B, curve 6100 represents an exemplary initial (e.g., unshifted) C vs. V curve. It is seen that the capacitance axis bisects this curve. It is appreciated that curve 6100 is exemplifies the C vs. V curve of ideal dielectric, and that initial curve measurements in situ may vary. Acceptance criteria selected define a maximum deviance from curve 6100 and a direction and degree of shift that characterize passable test results for the flash memory ILD under test.

In step 604, high program and/or erase voltages are applied in pulses of predetermined length for a predetermined time. Upon completion of this high voltage stressing, in step 605 the capacitance versus voltage curve is re-plotted. It is determined in step 606 whether there is any change (e.g., shift) in the C vs. V curve. Such a shift can be indicative of charging of the ILD, which can portend data loss by evaporation of charge in the ILD of the flash memory device being characterized by the test structure. As depicted in FIG. 6B, the C vs. V curve can shift along the voltage axis either to the right or to the left. Curve 6800 depicts a shift to the right. This is indicative of a negative charge persisting in the ILD. Similarly, curve 6900 depicts a shift to the left. This is indicative of a positive charge persisting in the ILD. It is appreciated that the shifts shown in FIG. 6B are exemplary and that shifts in actual ILD may be to greater or lesser degrees, and may display other changes, such as in curve shape.

If a shift in the C vs. V curve is detected, then in step 607 the direction and degree of the shift is determined. In step 608, the results are determined according to the pre-selected acceptance criteria. Upon determining correspondence to the acceptance criteria, or if no shift in the C vs. V curve was detected, then it is determined whether there are more ILD layers to test. If there are more ILD layers to test, then process 600 loops back to step 601 and repeats for the subsequent ILD layers. If there are no more ILD layers to test, process 600 is complete. Alternatively, in another embodiment, leakage current tests may be performed with a test structure such as test structure 500 of FIG. 8.

Figure 7:
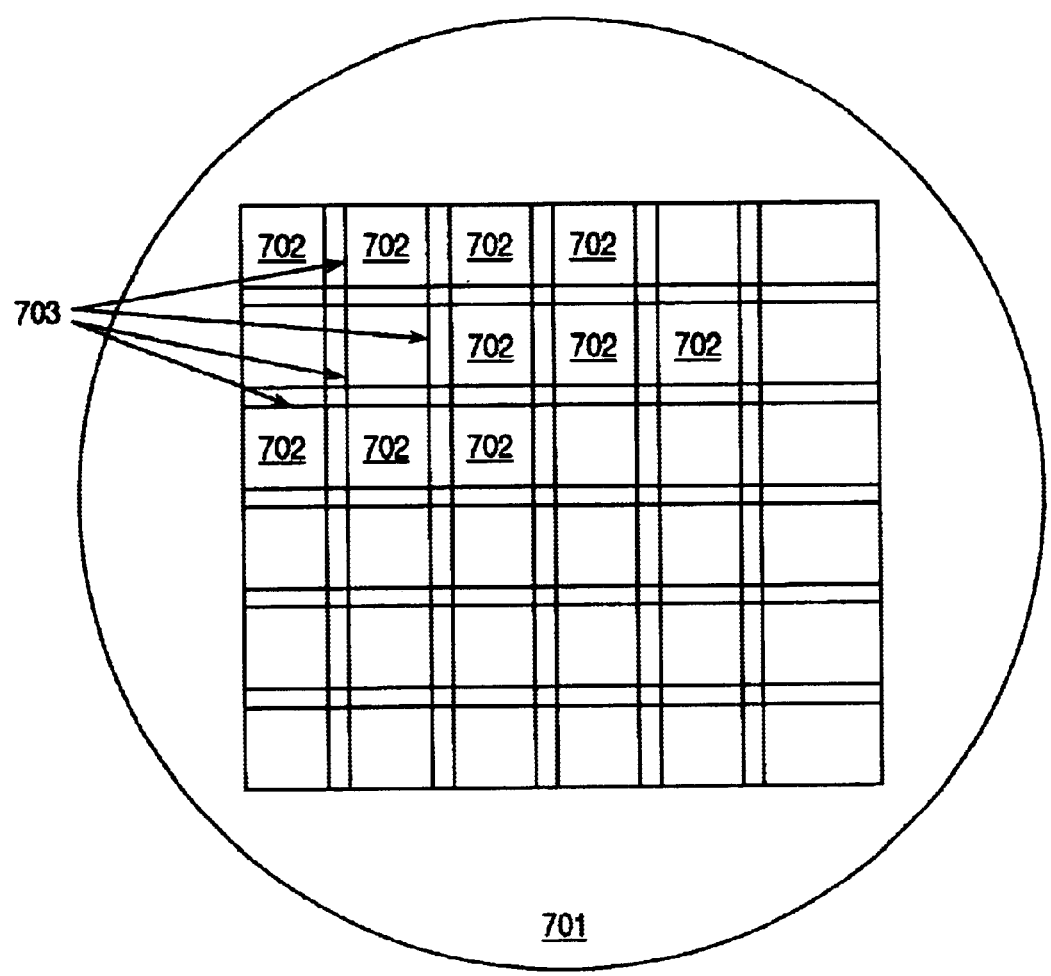
FIG. 7 is a diagram of a test chip deploying a test structure, in accordance with one embodiment of the present invention.

Test structures such as test structure 200 (FIG. 2) and test structure 500 (FIG. 5) can be implemented in custom fabricated devices. However, in one embodiment, test structures are fabricated along with the flash memory devices they are built to characterize. Referring to FIG. 7, a test structure fabrication scheme 700 is depicted. A silicon wafer 701 is fabricated by processes known in the art to produce individual flash memory devices 702 to be singulated upon a stage of production along the scrub lines between the individual flash memory devices 702.

In one embodiment, test chips 703 are fabricated during the processes producing the flash memory devices 702 within the scrub lines separating the individual flash memory devices 702. Test chips 703 thus function as scrub line monitors and can then be used to characterize the ILD comprising the individual flash memory devices 702 prior to singulating them. Upon completion of ILD characterization testing, such as by processes 300 and 600 above for example, the individual flash memory devices 702 can be separated by singulation for subsequent fabrication.

In one embodiment, the test chips 703 are also be fabricated in such a way as to deploy another test structure for characterization testing of metal conductors used in the fabrication of the flash memory devices.

Figure 8:
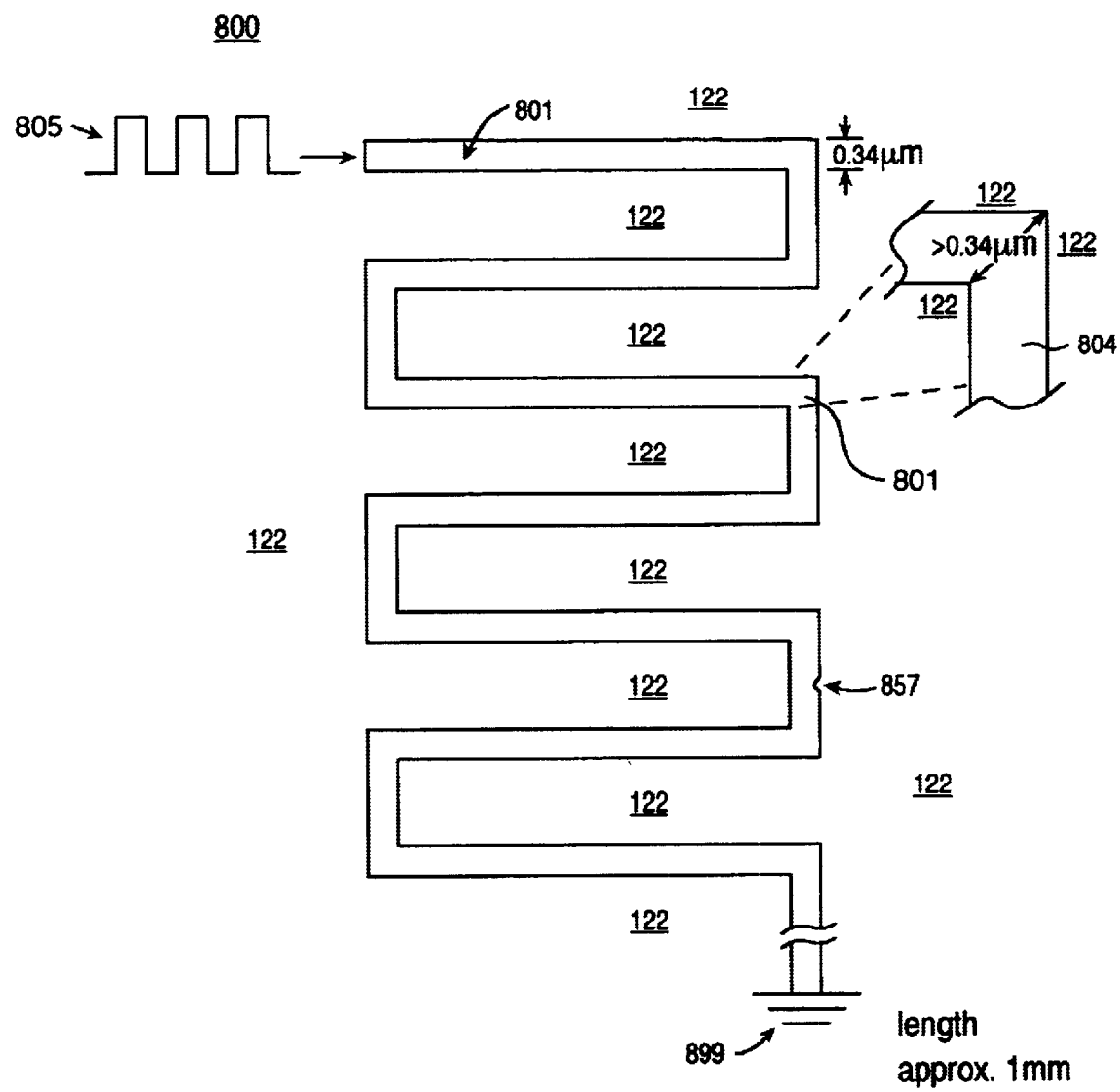
FIG. 8 is a diagram of a test structure for determining electrical degradation of a metal conductor according to one embodiment of the present invention.

With reference to FIG. 8, an exemplary test conductor 801 effectuates characterization by testing of the metal conductors used in flash memory devices. Test conductor 901 exemplifies the metal lines routed throughout typical flash memory devices for testing, each of which is on the order of several thousand Angstroms in thickness. In one embodiment, test conductor 801 is 0.34 μm in width. However, it is extremely long in comparison to its thickness; on the order of 500 μm to 1 mm.

To effectuate more realistic testing to characterize the conductors comprising the associated flash memories, test conductor 801 is routed in situ through the same ILD 122 comprising the associated flash memory to form a test structure 800. Test conductor 801 is routed through ILD 122 such that test conductor 801 is articulated many times back upon itself. In this configuration, test high voltage pulses, on the order of the program and/or erase voltages, from 7 V to 18 V are coupled into test conductor 800 to drive a current to a ground 899, to which an oppositely polarized voltage (e.g., return) is coupled. Test structure 800 may, in one embodiment, be deployed on a test chip (e.g., test chip 703; FIG. 7).

As the current flows through test conductor 801, the same effects the conductors comprising the associated flash memories are subjected to occur within the test conductor 801. Conductor angle 804, seen also in blown up detail in FIG. 8, has a dimension from inside corner to outside corner greater than the overall straight line thickness of test conductor 801. As the current driven by test voltage 805 flows through angle 804, current crowding occurs, resulting in localized heating. The heat generated at angle 804 may form a local hotspot, if it is not dissipated well through ILD 122 surrounding it.

If this heating becomes extreme, it can cause deterioration of the ILD 122 in the area, exacerbating the effect. Further, if it becomes too hot, it can cause electromigration of conductor atoms into the surrounding ILD 122, which decrease its dielectric constant. Test conductor 801 can form a local defect due to this heating, such as local defect 857. In extreme cases, test conductor 801 can melt open. By testing for such defects in a test conductor such as conductor 801, associated with a co-fabricated batch of flash memories, product development testing, quality control testing, and other modalities can ascertain the quality of the conductors within the associated flash memories.

Figure 9:
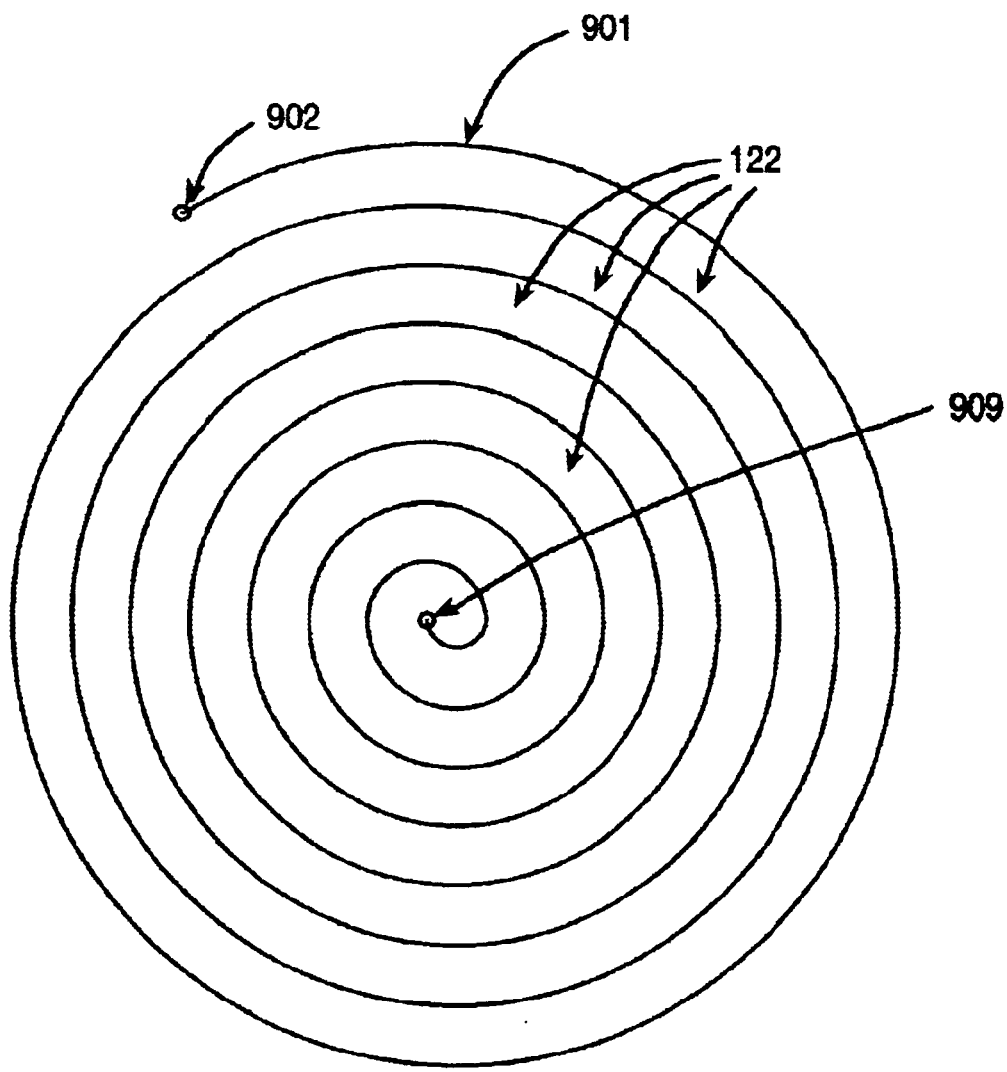
FIG. 9 is a diagram of another test structure for determining electrical degradation of a metal conductor according to one embodiment of the present invention.

To save space in test chips deploying a test conductor, the test conductor can be routed, instead of in a repeatedly articulated structure such as test conductor 801, in a spiral. This is depicted in FIG. 9, wherein test conductor 901 is so deployed in a test structure 900. Test conductor terminals 902 and 909 denote places whereon high voltage may be applied to test conductor 901. Test conductor 901 is routed through ILD 122 for realistic in situ testing. In this embodiment, the effects of current crowding are minimized such that somewhat less obvious effects of high voltage driven currents on the conductor can be more easily ascertained. Test structure 900 may, in one embodiment, be deployed on a test chip (e.g., test chip 703; FIG. 7).

Figure 10:
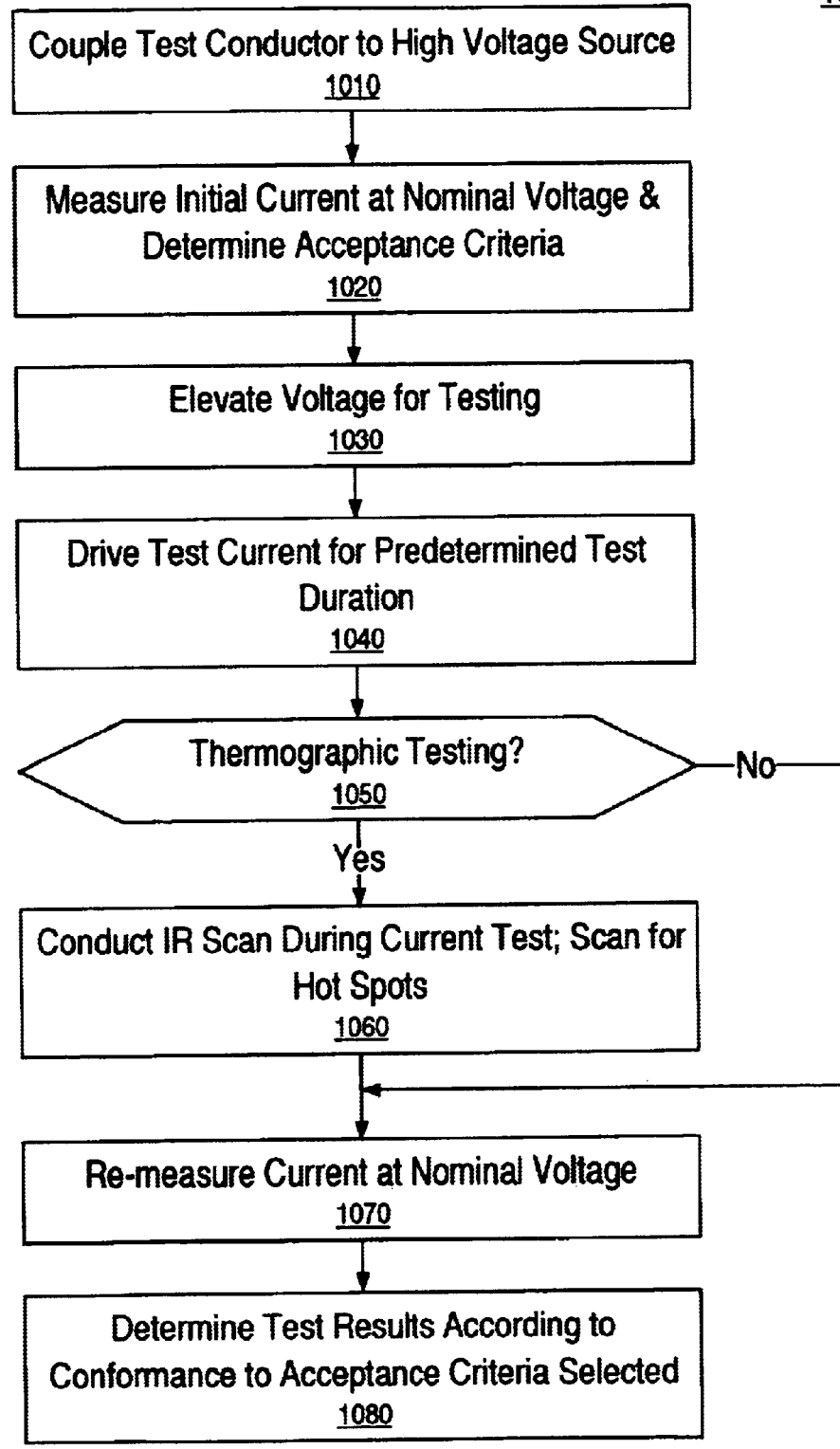
FIG. 10 is a flowchart of the steps in a process for testing the conductors of flash memory, in accordance with one embodiment of the present invention.

With reference to FIG. 10, a process 1000 is described for testing the conductors associated with flash memories. Process 1000 begins with step 1010, wherein a test conductor, such as test conductor 800 or 900 (FIGS. 8, 9, respectively) is coupled to a high voltage test source.

In step 1020, an initial measurement of current flow through the test conductor is made at a nominal operating voltage level. Acceptance criteria are determined. In step 1030, the test voltage is elevated to commence testing. The test voltage may be continuous pulses of a predetermined pulse duration at program and/or erase voltage levels, or some other elevated voltage level between them, such as 10 V. In step 1040, the test current driven by the elevated voltage is applied for the predetermined duration of the test.

In step 1050, it is determined if thermographic evaluation is to accompany the current driving testing. If it is determined that thermographic study is to be conducted, then in step 1060, infrared scanning is conducted concurrently with the current driving test.

Then in step 1070, or if no thermographic testing was made, driving the test current at the elevated voltage level ceases and the current is measured again at the nominal operating voltage In step 1080, the current is compared to the original value and the test results are determined according to conformance with the acceptance criteria selected, completing process 1000.

An embodiment of the present invention, a test structure to measure interlayer dielectric charging and breakdown and detect metal defects in flash memories, is thus described. While the present invention has been described in particular embodiments, it should be appreciated that the present invention should not be construed as limited by such embodiments, but rather construed according to the following claims.

What is claimed is:

1. An apparatus for testing a dielectric property of a material comprising the interlayer dielectric of a flash memory device, comprising:
- a layer (220) of said material disposed throughout a test structure (200) representative of said flash memory device wherein said apparatus is deployed upon a test chip (703), wherein said test chip (703) is fabricated with said flash memory device (702) from the same wafer (701); and
- a plurality of conductors (117A, 117B, 117C) disposed within said layer (220), wherein said conductors (117A, 117B, 117C) function to electrically test said layer (220).

2. The apparatus as recited in claim 1 wherein said plurality of conductors (117A, 117B, 117C) function as test electrodes.

3. The apparatus as recited in claim 2 wherein said test electrodes function to couple a voltage source to said apparatus.

4. The apparatus as recited in claim 2 wherein said test electrodes further function to measure said dielectric property.

5. The apparatus as recited in claim 2 wherein said voltage source is coupled to said apparatus on a pair of said test electrodes, wherein said pair of test electrodes are, selectively, adjacent to each other, and not adjacent to each other.

6. The apparatus as recited in claim 1 wherein said dielectric property is selected from the group consisting essentially of dielectric absorption, dielectric breakdown, leakage current passage at applied voltage, leakage current passage at rising voltage, and threshold voltage.

7. The apparatus as recited in claim 1, wherein said test chip (703) is fabricated in a scrub layer adjacent to said flash memory device.

8. An apparatus for testing a dielectric property of a material comprising the interlayer dielectric of a flash memory device, comprising:
- a pair of planar conductors (402, 404; 502, 503; 504, 505; 506, 507; 508, 509) deposited such that said conductors (402, 404) are substantially parallel to each other; and
- a layer (122) of said material disposed between said planar conductors (402, 404; 502, 503; 504, 505; 506, 507; 508, 509) to form a capacitor-like test structure (400, 500) representative of said flash memory device wherein said apparatus is deployed upon a test chip (703), wherein said test chip (703) is fabricated with said flash memory device (702) from the same wafer (701).

9. The apparatus as recited in claim 8 wherein said dielectric property is selected from the group consisting essentially of dielectric charging, capacitance versus voltage, dielectric absorption, dielectric breakdown, leakage current passage at applied voltage, leakage current passage at rising voltage, and threshold voltage.

10. The apparatus as recited in claim 8 wherein said planar conductors (402, 404; 502, 503; 504, 505; 506, 507; 508, 509) function to apply a test voltage to said apparatus.

11. The apparatus as recited in claim 8, wherein said test chip (703) is fabricated in a scrub layer adjacent to said flash memory device (702).

12. An apparatus for testing a conductive property of a material comprising the conducting lines of a flash memory device, comprising:
- a dielectric material (122) disposed throughout a test structure (800, 900) representative of said flash memory device wherein said apparatus is deployed upon a test chip (703), wherein said test chip (703) is fabricated with said flash memory device (702) from the same wafer (701); and
- a conductor (801, 901) disposed within said dielectric material (122).

13. The apparatus as recited in claim 12 wherein said conductor (801) has a length and a width and wherein said length is greater than said width.

14. The apparatus as recited in claim 13 wherein said length is distributed along an articulated route.

15. The apparatus as recited in claim 13 wherein said length is distributed along a spiral route.

16. The apparatus as recited in claim 12, wherein said test chip (703) is fabricated in scrub layer adjacent to said memory device (702).

17. The apparatus as recited in claim 14 wherein said conductive property is selected from the group consisting essentially of conductivity, resistivity, change in conductivity following current conduction, change in resistivity following current conduction, impedance, localized heating, and thermographic scanning.

* * * * *